United States Patent
Fishman et al.

(10) Patent No.: US 7,415,259 B2
(45) Date of Patent: Aug. 19, 2008

(54) AUTOMATIC GAIN CONTROL FOR SATELLITE DIGITAL AUDIO RADIO SERVICE RECEIVER, METHOD OF AUTOMATICALLY CONTROLLING GAIN AND SDARS RECEIVER INCORPORATING THE SAME

(75) Inventors: David A. Fishman, Lakewood, NJ (US); Robert C. Malkemes, Bricktown, NJ (US); Denis P. Orlando, Freehold, NJ (US); Jie Song, Marlboro, NJ (US); Eric Zhong, East Brunswick, NJ (US); Ying Zhu, Basking Ridge, NJ (US)

(73) Assignee: Agere Systems Inc., Allentown, PA (US)

( * ) Notice: Subject to any disclaimer, the term of this patent is extended or adjusted under 35 U.S.C. 154(b) by 464 days.

(21) Appl. No.: 10/876,041

(22) Filed: Jun. 24, 2004

(65) Prior Publication Data

US 2005/0287975 A1     Dec. 29, 2005

(51) Int. Cl.
*H04B 1/06* (2006.01)
(52) U.S. Cl. ............... 455/250.1; 455/136; 455/234.1; 455/340; 455/3.02; 375/345
(58) Field of Classification Search ............ 455/230, 455/232.1, 240.1, 250.1, 3.02, 134, 136, 455/234.1, 334, 338–341; 375/345
See application file for complete search history.

(56) References Cited

U.S. PATENT DOCUMENTS

| | | | | |
|---|---|---|---|---|
| 5,142,695 A | * | 8/1992 | Roberts et al. | 455/437 |
| 5,276,685 A | * | 1/1994 | Kepler et al. | 370/332 |
| 6,480,528 B1 | * | 11/2002 | Patel et al. | 375/148 |
| 6,804,501 B1 | * | 10/2004 | Bradley et al. | 455/138 |
| 7,065,164 B1 | * | 6/2006 | Sakima | 375/345 |
| 2003/0025623 A1 | * | 2/2003 | Brueske et al. | 341/139 |
| 2004/0005022 A1 | * | 1/2004 | Zhu et al. | 375/365 |
| 2006/0166634 A1 | * | 7/2006 | Ido | 455/277.1 |

\* cited by examiner

*Primary Examiner*—Edward Urban
*Assistant Examiner*—Nhan Le

(57) ABSTRACT

An automatic gain control (AGC) for a Satellite Digital Audio Radio Service (SDARS) receiver, a method of automatically controlling gain and a SDARS receiver incorporating the AGC or the method. In one embodiment, the AGC includes: (1) an AGC function selector configured to compare first and second time division multiplexed (TDM) power signals and a nonzero threshold and select an AGC function based thereon and (2) an AGC function applier associated with the AGC function selector and configured to apply the AGC function to the first and second TDM power signals to develop therefrom an AGC control signal.

18 Claims, 4 Drawing Sheets

AUTOMATIC GAIN CONTROL FOR SATELLITE DIGITAL AUDIO RADIO SERVICE RECEIVER, METHOD OF AUTOMATICALLY CONTROLLING GAIN AND SDARS RECEIVER INCORPORATING THE SAME

TECHNICAL FIELD OF THE INVENTION

The present invention is directed, in general, to automatic gain control (AGC) and, more specifically, to an AGC for a Satellite Digital Audio Radio Service (SDARS) receiver, a method of automatically controlling gain and a SDARS receiver incorporating the AGC or the method.

BACKGROUND OF THE INVENTION

The last several decades have brought significant changes to broadcast radio technology. First came amplitude modulation (AM) analog radio, then, in turn, frequency modulation (FM) analog radio, FM-AM and FM multiplex stereo analog radio, FM discrete stereo analog radio, FM multiplex quadraphonic analog radio and, finally, AM discrete stereo analog radio. Some of these radio technologies proved longer-lasting than others. However, the latest in high-tech broadcast radio, Satellite Digital Audio Radio Service, or SDARS, is capable of providing a new level of service to the subscribing public.

SDARS promises to overcome several perceived limitations of prior broadcast forms. All such prior forms are "terrestrial," meaning that their broadcast signals originate from Earth-bound transmitters. As a result, they have a relatively short range, perhaps a few hundred miles for stations on the AM and FM bands. Therefore, mobile broadcast recipients are often challenged with constant channel surfing as settled-upon stations slowly fade and new ones slowly come into range. Even within range, radio signals may be attenuated or distorted by natural or man-made obstacles, such as mountains or buildings. Radio signals may even wax or wane in power or fidelity depending upon the time of day or the weather. This only serves to compound the motorists' frustration.

Additionally, broadcast radio is largely locally originated. This constrains the potential audience that can listen to a particular station and thus the money advertisers are willing to pay for programming and on-air talent. While the trend is decidedly toward large networks of commonly-owned radio stations with centralized programming and higher-paid talent, time and regulatory change are required to complete the consolidation.

Finally, the Federal Communications Commission (FCC) defined the broadcast radio spectrum decades ago, long before digital transmission and even digital fidelity were realizable. The result is that the bandwidth allocated to an FM radio station is not adequate for hi-fidelity music, and the bandwidth allocated to an AM radio station is barely adequate for voice.

SDARS promises to change all of this. A user who has a SDARS receiver in his vehicle can tune into any one of a hundred or more nationwide stations with the promise of compact disc (CD) quality digital sound. By virtue of satellite redundancy, transmission from overhead and transcontinental coverage substantial provides immunity to service interruption. Satellite technology appears to be doing for radio what cable and satellite technologies have done for television.

While SDARS uses satellites for broad-area coverage, SDARS calls for terrestrial repeaters capable of transmitting relatively strong signals to augment the satellites by filling-in data when and where satellite signals may be too weak. Satellite signals are particularly prone to being weakened in urban areas due to the buildings, bridges and tunnels.

To promote competition in SDARS, the U.S. Government has divided the 25 MHz S-band allocated to SDARS into two equal 12.5 MHZ subbands and licensed those subbands to two separate companies: Sirius (www.sirius.com) and XM (www.xmradio.com). Each company operates its own independent service, including its own constellation of satellites and its own network of terrestrial repeaters, located mostly of course in urban areas.

Unfortunately, because terrestrial repeater signals tend to be stronger than satellite signals and because the two SDARS services occupy proximate subbands, interference can degrade the two services. A particular concern arises when a terrestrial repeater of one service introduces noise into the satellite signals of the other service. The noise plays havoc with the way SDARS receivers interpret the signals they are trying to receive. It is especially troubling that the urban areas where interference is most likely to occur is where most SDARS subscribers are located.

Accordingly, what is needed in the art is a way to handle interference occurring in SDARS signals and a SDARS receiver that is more immune to signal interference.

SUMMARY OF THE INVENTION

Those skilled in the pertinent art have long understood that filters can be used to reduce the noise interference creates in a received signal, including those received from satellites. However, the present invention recognizes that interference can degrade receiver performance in another, more subtle way: the noise or distortion increases the perceived power of the received satellite signal. SDARS receivers use automatic gain control (AGC) based on the power of the received satellite signal to control the initial amplification of the received satellite signal. When a conventional SDARS AGC falsely perceives the received satellite's signal to be stronger than it really is, the AGC responds by calling for less amplification of the signal. Consequently, the remainder of the receiver has a more difficult time processing the underamplified signal, which, because SDARS receivers are predominantly digital, often means that the subscriber's service is temporarily completely, but unnecessarily, interrupted.

Therefore, in one aspect, the present invention provides an AGC for a SDARS receiver. In one embodiment, the AGC includes: (1) an AGC function selector configured to compare first and second time division multiplexed (TDM) power signals and a nonzero threshold and select an AGC function based thereon and (2) an AGC function applier associated with the AGC function selector and configured to apply the AGC function to the first and second TDM power signals to develop therefrom an AGC control signal.

In another aspect, the present invention provides a method of automatically controlling gain. In one embodiment, the method includes: (1) comparing first and second TDM power signals and a nonzero threshold, (2) selecting an AGC function based thereon and (3) applying the AGC function to the first and second TDM power signals to develop therefrom an AGC control signal.

In yet another aspect, the present invention provides a SDARS receiver. In one embodiment, the SDARS receiver includes: (1) an antenna configured to receive first and second satellite signals, (2) a low-noise amplifier (LNA) coupled to the antenna and configured to amplify the first and second satellite signals in response to an AGC control signal to yield amplified first and second satellite signals, (3) an analog to digital converter (ADC) coupled to the LNA and configured to convert the amplified first and second satellite signals to yield digitized first and second satellite signals, (4) a digital downconverter (DDC) coupled to the ADC and configured to downconvert the digitized first and second satellite signals to yield downconverted first and second satellite signals, (5) first and second TDM demodulators coupled to the DDC and configured to develop corresponding first and second TDM power signals from the downconverted first and second satellite signals and (6) an AGC coupled to the LNA and the first and second TDM demodulators and having: (6a) an AGC function selector configured to compare the first and second TDM power signals and a nonzero threshold and select an AGC function based thereon and (6b) an AGC function applier associated with the AGC function selector and configured to apply the AGC function to the first and second TDM power signals to develop therefrom an AGC control signal for the LNA.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
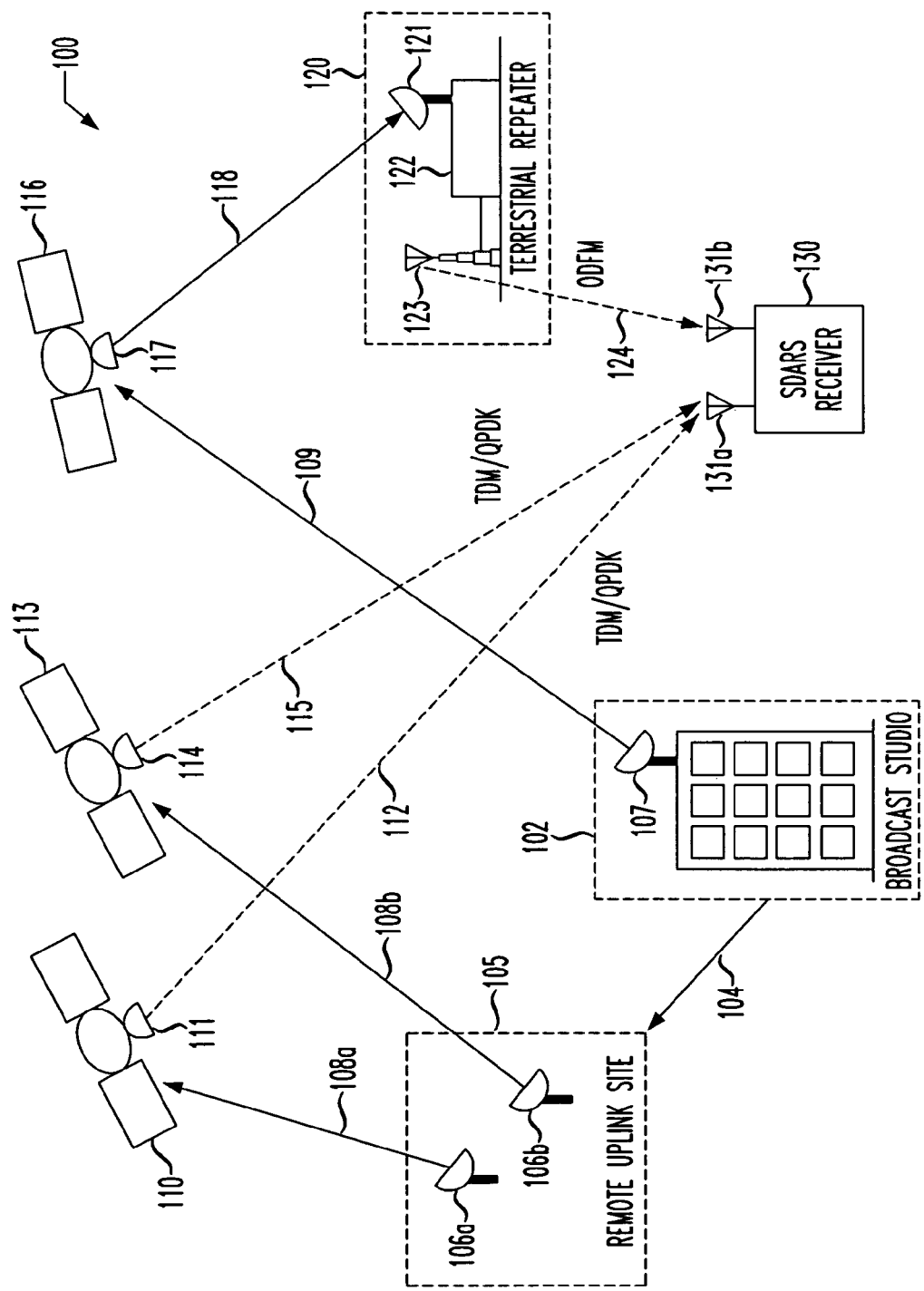
FIG. 1 illustrates a highly schematic diagram of one embodiment of a Satellite Digital Audio Radio Service (SDARS) incorporating an automatic gain control (AGC) constructed according to the principles of the present invention.

Referring initially to FIG. 1, illustrated is a highly schematic diagram of one embodiment of a Satellite Digital Audio Radio Service (SDARS), generally designated 100, incorporating an automatic gain control (AGC) constructed according to the principles of the present invention. The SDARS 100 includes a SDARS broadcast studio 102, a remote uplink site 105, first and second SDARS satellites 110, 113, a Very Small Aperture Terminal (VSAT) satellite 116 and a terrestrial repeater 120.

The SDARS broadcast studio 102 generates composite signals containing multiple audio and control channel signals. These composite signals are sent, via a remote transmission signal 104, to a remote uplink site and a VSAT transmitter (not shown) to the VSAT satellite 116 via a VSAT uplink antenna 107. The remote uplink site 105 receives the remote transmission signal 104 and includes first and second satellite uplink antennas 106a, 106b to direct the SDARS broadcast to the first and second SDARS satellites 110, 113. The first and second SDARS satellites 110, 113 include first and second SDARS satellite antennas 111, 114, respectively. The VSAT satellite 116 includes a VSAT satellite antenna 117. The terrestrial repeater 120, which is one of a network of terrestrial repeaters, includes a VSAT downlink antenna 121, a repeater signal conditioner 122 and a terrestrial repeater antenna 123.

The SDARS 100 operates in the S-band frequency range and provides compact disc (CD) quality audio programming to a subscriber. The SDARS broadcast provider transmits first and second satellite broadcast signals 108a, 108b to each of the first and second SDARS satellites 110, 113, employing the first and second satellite uplink antennas 106a, 106b, respectively. Each of the first and second satellite broadcast signals 108a, 108b contains a collection of separate channels, or clusters, available for selection by the subscriber. In the illustrated embodiment, first and second TDM satellite signals 112, 115 are quadrature phase shift keyed (TDM/QPSK).

In parallel with these TDM satellite transmissions, the SDARS broadcast studio 102, the VSAT satellite 116 and the terrestrial repeater 120 cooperate to provide first, second and third terrestrial broadcast signals 109, 118, 124, respectively. These terrestrial broadcast signals employ a coded orthogonal frequency division multiplex (OFDM) frequency structure that provides a stronger, but shorter-ranged version of the first and second TDM satellite signals 112, 115. As shown, the terrestrial repeater 120 employs the second terrestrial broadcast signal 118 from the VSAT satellite 116 to provide the third terrestrial broadcast signal 124. The VSAT downlink antenna 121 receives the second terrestrial broadcast signal 118 wherein the repeater signal conditioner 122 conditions it for delivery and transmission by the terrestrial repeater antenna 123.

The SDARS receiver 130 employs a satellite signal antenna 131a for receiving TDM satellite signals and a repeater signal antenna 131b for receiving coded OFDM signals and includes RF/IF and digital portions that will be described more particularly in conjunction with FIG. 2.

Figure 2:
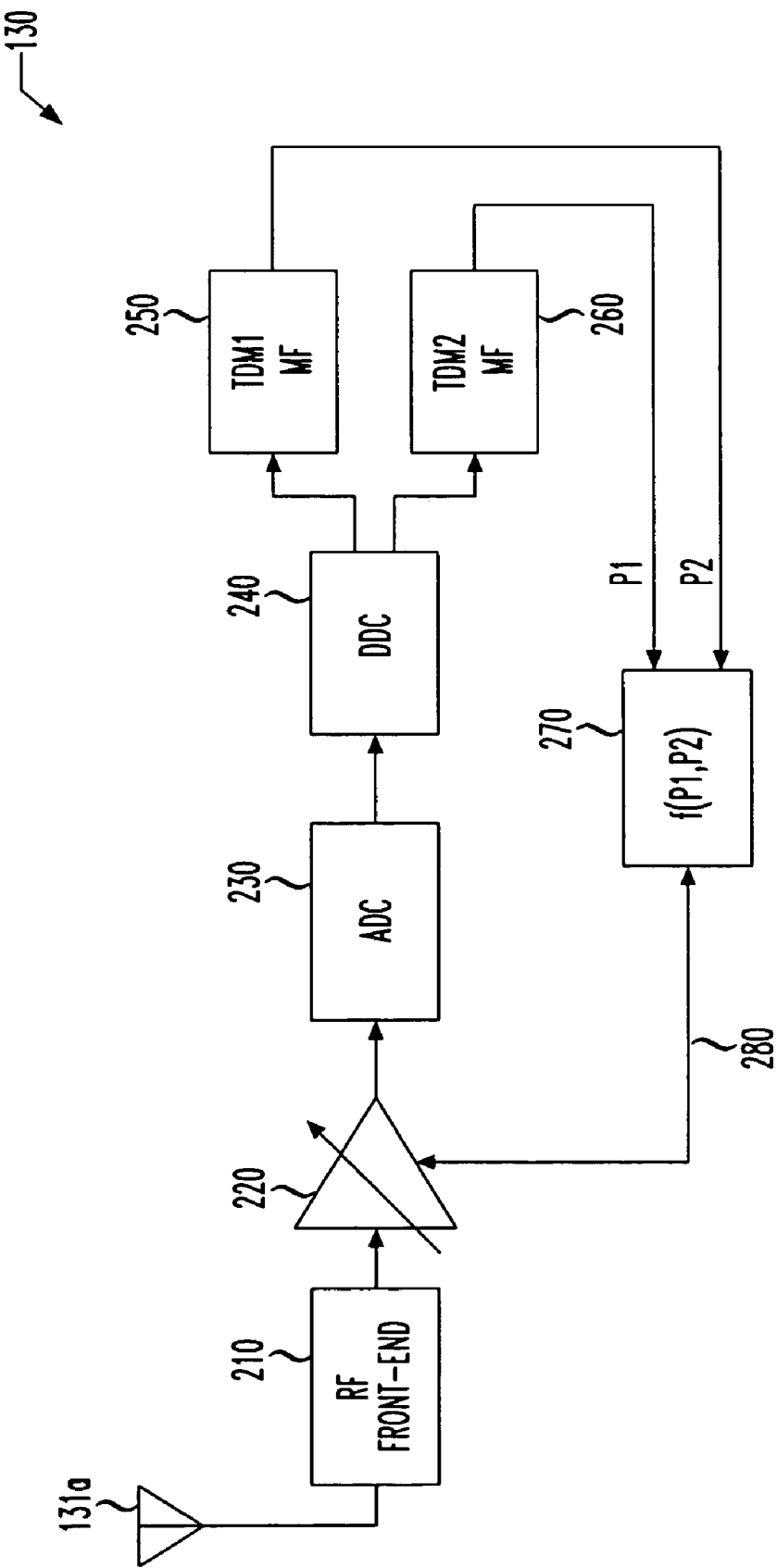
FIG. 2 illustrates a simplified block diagram of one embodiment of a SDARS receiver incorporating an AGC constructed according to the principles of the present invention.

Turning now to FIG. 2, illustrated is a simplified block diagram of one embodiment of the SDARS receiver 130 of FIG. 1 and incorporating an AGC constructed according to the principles of the present invention. The SDARS receiver 130 includes the satellite signal antenna 131a of FIG. 1. The antenna 131a is configured to receive first and second TDM satellite signals as described above.

The SDARS receiver 130 further includes an RF front-end 210. The RF front-end 210 is coupled to the antenna 131a and is configured to amplify and downconvert the first and second satellite signals to levels and frequencies suitable for application to a variable gain amplifier (VGA) 220. The VGA 220 is configured to amplify the first and second satellite signals in response to an automatic gain control (AGC) control signal 280 to yield amplified first and second satellite signals. Those skilled in the pertinent art understand the structure and function of the VGA 220.

As stated above, it is important that the AGC control signal 280 provided to the VGA 220 be appropriately tailored to the first and second satellite signals. If it is not, suboptimal signal processing and a loss of service may result.

The SDARS receiver 130 further includes an analog to digital converter (ADC) 230. The ADC 230 is coupled to the VGA 220 and is configured to convert the amplified first and second satellite signals to yield digitized first and second satellite signals. Signal processing in the receiver 130 from the ADC 230 on occurs in the digital domain. Those skilled in the pertinent art understand the structure and function of the ADC 230.

The SDARS receiver 130 still further includes a digital downconverter (DDC) 240. The DDC 240 is coupled to the ADC 230 and is configured to downconvert the digitized first and second satellite signals to yield downconverted first and second satellite signals. Those skilled in the pertinent art understand the structure and function of the DDC 240.

The SDARS receiver 130 yet further includes first and second time division multiplexing (TDM) demodulators 250, 260. The first and second TDM demodulators 250, 260 are coupled to the DDC 240 and are configured to develop corresponding first and second TDM power signals P1, P2 from the downconverted first and second satellite signals. In the illustrated embodiment, the first and second TDM power signals P1, P2 are in the form of digital numbers. Those skilled in the pertinent art understand the structure and function of the first and second TDM demodulators 250, 260.

The SDARS receiver 130 still further includes an AGC 270. The AGC 270 is coupled to both the VGA 220 and the first and second TDM demodulators 250, 260. The AGC 270 is designed to receive the first and second TDM power signals P1, P2 and develop therefrom the AGC control signal 280. An exemplary embodiment of the AGC 270 will now be described with reference to FIG. 3.

Figure 3:
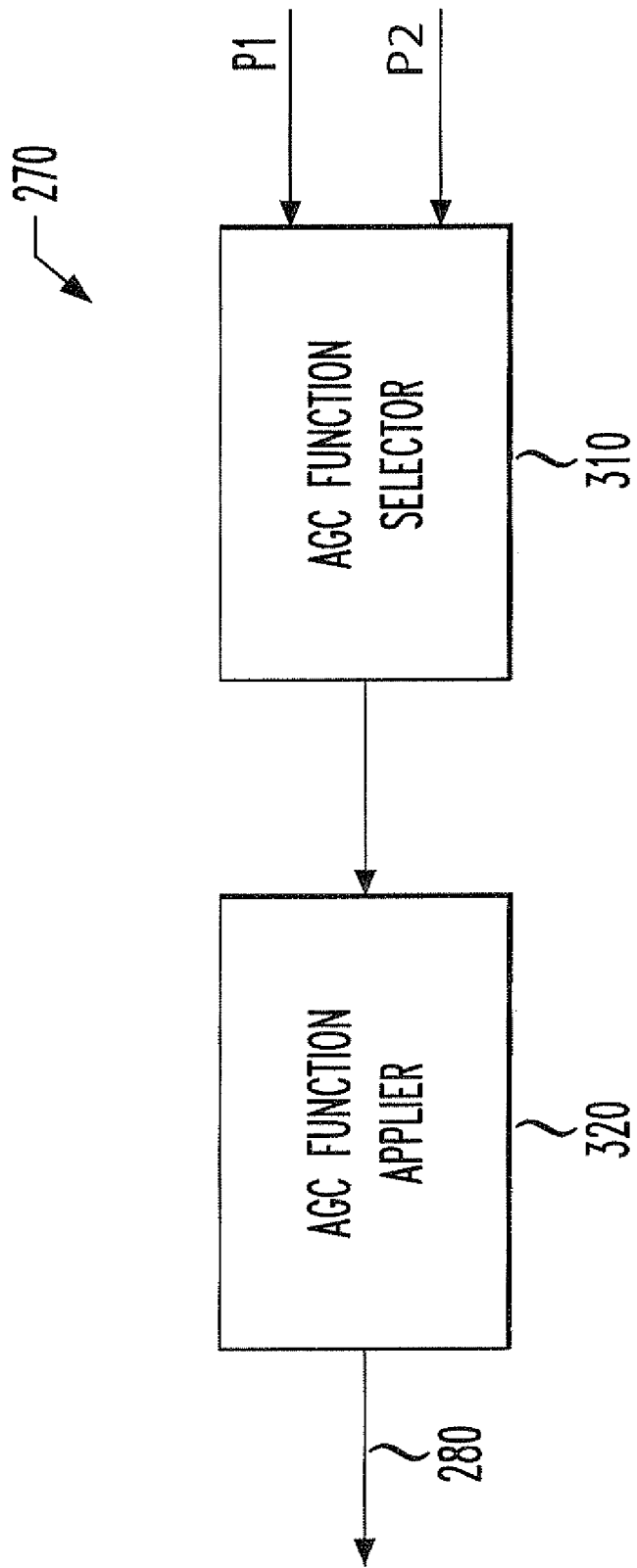
FIG. 3 illustrates a block diagram of one embodiment of an AGC for a SDARS receiver constructed according to the principles of the present invention.

Turning now to FIG. 3, illustrated is a block diagram of one embodiment of an AGC 270 for a SDARS receiver (e.g., 130 of FIG. 1) constructed according to the principles of the present invention.

The AGC 270 includes an AGC function selector 310. The AGC function selector 310 is configured to compare the first and second TDM power signals P1, P2 and a nonzero threshold and select an AGC function based thereon. Many ways to compare P1, P2 and the nonzero threshold exist. Many different AGC functions also exist. However, some examples of comparisons and functions will now be set forth.

Those examples will be based on an observation that, in one real-world case, XM terrestrial repeaters interfere with Sirius' second satellite signal, injecting unwanted noise and distortion and increasing its apparent power. In the absence of such interference, it has been found that an AGC function of $f_{(P1,P2)}=\max(P1,P2)$ (the greater one of the first and second TDM power signals) yields a suitable AGC control signal. However, in the face of such interference, P2 is artificially high, resulting in P2 being selected even when P1 would be the more appropriate choice.

Thus, the present invention introduces the nonzero threshold: T. T is advantageously employed to determine when P2 is too high to form a reliable basis for AGC. In the examples given below, the nonzero threshold T represents the difference between the first and second TDM power signals. T may be, for example, 4 dB. Those skilled in the pertinent art will understand, however, that this need not be the case.

EXAMPLE 1

Two AGC Functions, One Step

For Example 1, it will be assumed that, if P2−P1<T, the max(P1,P2) AGC function is suitable for developing the AGC control signal. However, if P2−P1>=T, another AGC function is needed. In Example 1, that AGC function is $f_{(P1,P2)}=P1$ (simply the first TDM power signal). Thus, the following two AGC functions result:

$$f_{(P1,P2)} = \begin{cases} \max(P1, P2) & P2 - P1 < T \\ P1 & P2 - P1 >= T \end{cases}.$$

One possible disadvantage of Example 1 is that a step exists between the $f_{(P1,P2)}=\max(P1,P2)$ AGC function and the $f_{(P1,P2)}=P1$ AGC function. The instability in the AGC control signal that results from the step may be sufficient to cause bit error rates (BER) in the SDARS receiver 130 of FIG. 1 to increase to an unacceptable level. However, the step may be acceptable in some applications.

EXAMPLE 2

Three AGC Functions, Two Steps

For Example 2, it will again be assumed that, if P2−P1<T, the $f_{(P1,P2)}=\max(P1,P2)$ AGC function is suitable for developing the AGC control signal. However, the $f_{(P1,P2)}=P1$ AGC function will only be allowed when P2−P1>2T. In the interim region of T<=P2−P1<2T, a third AGC function will be selected (with the goal of decreasing the step of Example 1). In Example 2, that AGC function is $f_{(P1,P2)}=(P1+P2)/2$ (an average of the first and second TDM power signals). Thus, the following three AGC functions result:

$$f_{(P1,P2)} = \begin{cases} \max(P1, P2) & P2 - P1 < T \\ (P1 + P2)/2 & T <= P2 - P1 < 2T \\ P1 & P2 - P1 >= 2T \end{cases}.$$

It is apparent, however, that two steps exist between the $f_{(P1,P2)}=(P1+P2)/2$ AGC function and the $f_{(P1,P2)}=P1$ AGC function. The instability in the AGC control signal that results from these two somewhat smaller steps may still be sufficient to cause BER in the SDARS receiver 130 of FIG. 1 to increase to an unacceptable level. However, the steps may be acceptable in most if not all applications.

EXAMPLE 3

Three AGC Functions, No Steps

For Example 3, it will again be assumed that, if P2−P1<T, the $f_{(P1,P2)}=\max(P1,P2)$ AGC function is suitable for developing the AGC control signal and also that the $f_{(P1,P2)}=P1$ AGC function is suitable when P2−P1>2T. In the interim region of T<=P2−P1<2T, an alternative third AGC function will be selected (with the goal of eliminating the steps of Example 2). In Example 3, that AGC function is $f_{(P1,P2)}=2(P1+T)−P2$ (a difference between twice a sum of the first TDM power signal and the nonzero threshold and the second TDM power signal). Thus, the following three AGC functions result:

$$f_{(P1,P2)} = \begin{cases} \max(P1, P2) & P2 - P1 < T \\ 2(P1 + T) - P2 & T <= P2 - P1 < 2T \\ P1 & P2 - P1 >= 2T \end{cases}.$$

It is apparent that the steps of Examples 1 and 2 have been eliminated, which should improve the stability in the AGC control signal and the resulting BER in the SDARS receiver.

Those skilled in the pertinent art will readily see that many variations of the above examples are possible. Other multiples of the nonzero threshold may be useful to define other function domains. Multiple nonzero thresholds may be used. Many other AGC functions and numbers of AGC functions are possible, including those of higher-than-linear order.

The AGC 270 further includes an AGC function applier 320. The AGC function applier 320 is associated with the AGC function selector 310 and is configured to apply the AGC function that the AGC function selector 310 has selected to the first and second TDM power signals to develop from the selected AGC function the AGC control signal (280 of FIG. 2). The AGC 270 provides the AGC control signal to the VGA 220 of FIG. 2, which provides suitable low-noise amplification as the AGC control signal directs.

Figure 4:
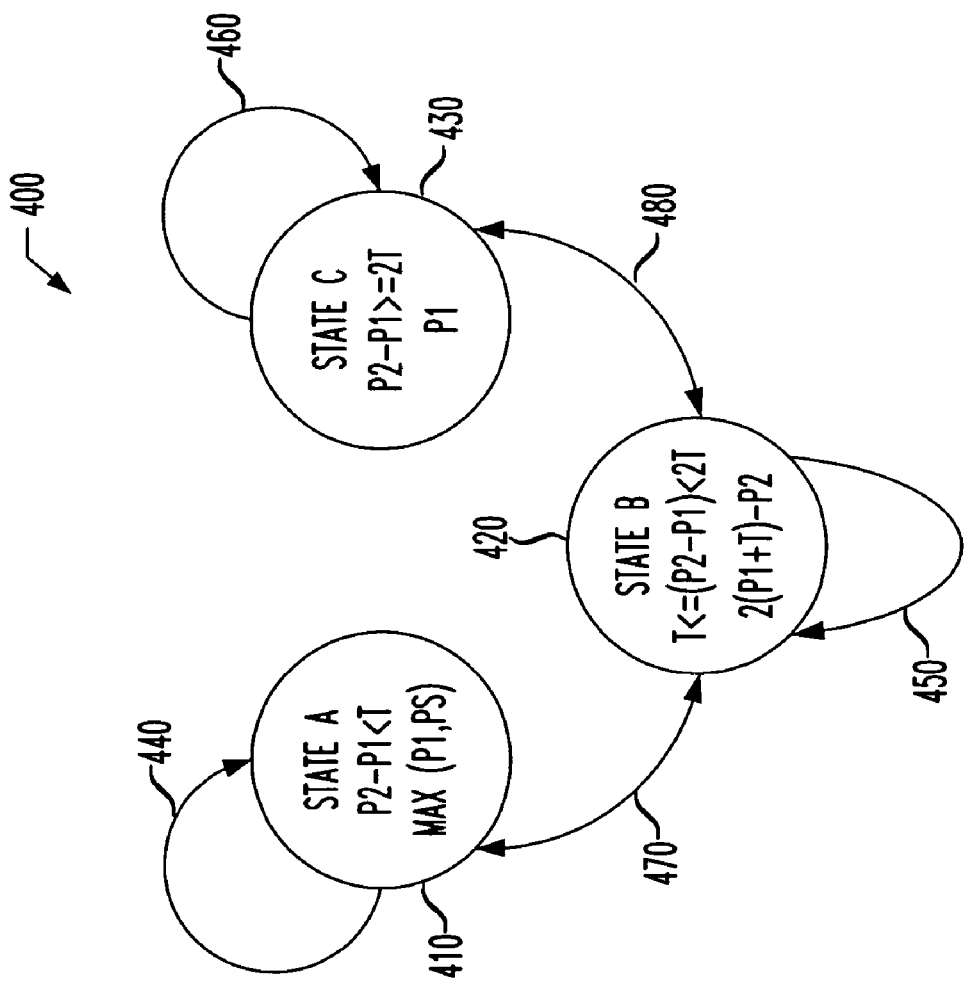
FIG. 4 illustrates a state diagram for the AGC of FIG. 3 that embodies a method of automatically controlling gain carried out according to the principles of the present invention.

Turning now to FIG. 4, illustrated is a state diagram, generally designated 400, for the AGC 270 of FIG. 3 that embodies a method of automatically controlling gain carried out according to the principles of the present invention.

The state diagram 400 includes a State A 410, a State B 420 and a State C 430 that respectively correspond to the domains P2−P1<T, T<=P2−P1<2T and P2−P1>=2T and, following Example 3, their corresponding AGC functions $f_{(P1,P2)}$=max (P1,P2), $f_{(P1,P2)}$=2(P1+T)−P2 and $f_{(P1,P2)}$=P1. Interconnecting State A 410, State B 420 and State C 430 are transition 440 (State A 410 to State A 410), transition 450 (State B 420 to State B 420), transition 460 (State C 430 to State C 430), transition 470 (State A 410 to State B 420) and transition 480 (State B 420 to State C 430).

The choice of which of the various transitions 440, 450, 460, 470, 480 to undertake is made by comparing first and second TDM power signals P1, P2 and the nonzero threshold T (and perhaps other signals or thresholds). The AGC function is selected by virtue of assuming one of State A 410, State B 420 and State C 430. Further, the AGC function is applied to the first and second TDM power signals based on the assumed State A 410, State B 420 or State C 430.

It is noted as an aside that a direct transition between State A 410 and State C 430 does not exist. This is based on the assumption that P1 and P2 are continuous and therefore incapable of leaping between State A 410 and State C 420 without passing through State B 420. If this assumption does not hold, the state diagram 400 should include a suitable additional transition.

While the method disclosed herein has been described and shown with reference to particular steps performed in a particular order, those skilled in the pertinent art will understand that these steps may be combined, subdivided, or reordered to form an equivalent method without departing from the teachings of the present invention. Accordingly, unless specifically indicated herein, the order and/or the grouping of the steps are not limitations of the present invention.

Although the present invention has been described in detail, those skilled in the art should understand that they can make various changes, substitutions and alterations herein without departing from the spirit and scope of the invention in its broadest form.

What is claimed is:

1. An automatic gain control (AGC) for a Satellite Digital Audio Radio Service (SDARS) receiver, comprising:
   an AGC function selector configured to compare first and second time division multiplexed (TDM) power signals and a nonzero threshold and select an AGC function based thereon from the group consisting of: a greater one of said first and second TDM power signals, an average of said first and second TDM power signals, a difference between twice a sum of said first TDM power signal and said nonzero threshold and said second TDM power signal, and said first TDM power signal; and
   an AGC function applier associated with said AGC function selector and configured to apply said AGC function to said first and second TDM power signals to develop therefrom an AGC control signal.

2. The AGC as recited in claim 1 wherein said nonzero threshold represents a difference between said first and second TDM power signals.

3. The AGC as recited in claim 1 wherein said AGC function selector further compares said first and second TDM power signals to a multiple of said nonzero threshold.

4. The AGC as recited in claim 1 wherein said AGC function selector selects a first AGC function when said second TDM power signal exceeds said first AGC power signal by less than said nonzero threshold.

5. The AGC as recited in claim 1 wherein said AGC function selector selects a second AGC function when said second TDM power signal exceeds said first AGC power signal by more than said nonzero threshold and less than a multiple of said nonzero threshold.

6. The AGC as recited in claim 1 wherein said AGC function selector selects a third AGC function when said second TDM power signal exceeds said first AGC power signal by more than a multiple of said nonzero threshold.

7. A method of automatically controlling gain, comprising:
   comparing first and second time division multiplexed (TDM) power signals and a nonzero threshold;
   selecting an AGC function based thereon, wherein said AGC function is selected from the group consisting of: a greater one of said first and second TDM power signals, an average of said first and second TDM power signals, a difference between twice a sum of said first TDM power signal and said nonzero threshold and said second TDM power signal, and said first TDM power signal; and
   applying said AGC function to said first and second TDM power signals to develop therefrom an AGC control signal.

8. The method as recited in claim 7 wherein said nonzero threshold represents a difference between said first and second TDM power signals.

9. The method as recited in claim 7 further comprising further comparing said first and second TDM power signals to a multiple of said nonzero threshold.

10. The method as recited in claim 7 wherein said selecting comprises selecting a first AGC function when said second TDM power signal exceeds said first AGC power signal by less than said nonzero threshold.

11. The method as recited in claim 7 wherein said selecting comprises selecting a second AGC function when said second TDM power signal exceeds said first AGC power signal by more than said nonzero threshold and less than a multiple of said nonzero threshold.

12. The method as recited in claim 7 wherein said selecting comprises selecting a third AGC function when said second TDM power signal exceeds said first AGC power signal by more than a multiple of said nonzero threshold.

13. A Satellite Digital Audio Radio Service (SDARS) receiver, comprising:
   an antenna configured to receive first and second satellite signals;
   a variable gain amplifier (VGA) coupled to said antenna and configured to amplify said first and second satellite signals in response to an automatic gain control (AGC) control signal to yield amplified first and second satellite signals;

an analog to digital converter (ADC) coupled to said VGA and configured to convert said amplified first and second satellite signals to yield digitized first and second satellite signals;

a digital downconverter (DDC) coupled to said ADC and configured to downconvert said digitized first and second satellite signals to yield downconverted first and second satellite signals;

first and second time division multiplexing (TDM) demodulators coupled to said DDC and configured to develop corresponding first and second TDM power signals from said downconverted first and second satellite signals; and an AGC coupled to said VGA and said first and second TDM demodulators and including:

an AGC function selector configured to compare said first and second TDM power signals and a nonzero threshold and select an AGC function based thereon from the group consisting of: a greater one of said first and second TDM power signals, an average of said first and second TDM power signals, a difference between twice a sum of said first TDM power signal and said nonzero threshold and said second TDM power signal, and said first TDM power signal, and an AGC function applier associated with said AGC function selector and configured to apply said AGC function to said first and second TDM power signals to develop therefrom an AGC control signal for said VGA.

14. The SDARS receiver as recited in claim 13 wherein said nonzero threshold represents a difference between said first and second TDM power signals.

15. The SDARS receiver as recited in claim 13 wherein said AGC function selector further compares said first and second TDM power signals to a multiple of said nonzero threshold.

16. The SDARS receiver as recited in claim 13 wherein said AGC function selector selects a first AGC function when said second TDM power signal exceeds said first AGC power signal by less than said nonzero threshold.

17. The SDARS receiver as recited in claim 13 wherein said AGC function selector selects a second AGC function when said second TDM power signal exceeds said first AGC power signal by more than said nonzero threshold and less than a multiple of said nonzero threshold.

18. The SDARS receiver as recited in claim 13 wherein said AGC function selector selects a third AGC function when said second TDM power signal exceeds said first AGC power signal by more than a multiple of said nonzero threshold.

* * * * *